(12) United States Patent
Du et al.

(10) Patent No.: US 11,469,336 B2
(45) Date of Patent: Oct. 11, 2022

(54) PHOTODIODE, METHOD FOR PREPARING THE SAME, AND ELECTRONIC DEVICE

(71) Applicant: BOE TECHNOLOGY GROUP CO., LTD., Beijing (CN)

(72) Inventors: Jianhua Du, Beijing (CN); Chao Li, Beijing (CN); Zhaohui Qiang, Beijing (CN); Yupeng Gao, Beijing (CN); Feng Guan, Beijing (CN); Rui Huang, Beijing (CN); Zhi Wang, Beijing (CN); Yang Lv, Beijing (CN); Chao Luo, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 16/958,120

(22) PCT Filed: Jan. 17, 2020

(86) PCT No.: PCT/CN2020/072742
§ 371 (c)(1),
(2) Date: Jun. 25, 2020

(87) PCT Pub. No.: WO2020/156239
PCT Pub. Date: Aug. 6, 2020

(65) Prior Publication Data
US 2021/0217909 A1    Jul. 15, 2021

(30) Foreign Application Priority Data
Feb. 2, 2019    (CN) .................. 201910108010.X (51) Int. Cl.
*H01L 31/0224*    (2006.01)
*H01L 31/0376*    (2006.01)
(Continued)

(52) U.S. Cl.
CPC ............ *H01L 31/022466* (2013.01); *H01L 31/03762* (2013.01); *H01L 31/1884* (2013.01); *H01L 31/202* (2013.01)

(58) Field of Classification Search
CPC ....... H01L 31/022466; H01L 31/03762; H01L 31/1884; H01L 31/202; H01L 31/0224; H01L 31/0236; H01L 31/20; Y02E 10/50
(Continued)

(56) References Cited

U.S. PATENT DOCUMENTS 5,453,135 A * 9/1995 Nakagawa .......... H01L 31/0392
136/249
2003/0183270 A1  10/2003 Falk et al.
(Continued)

FOREIGN PATENT DOCUMENTS

CN    101779295 A    7/2010
CN    102150281 A    8/2011
(Continued)

OTHER PUBLICATIONS

State Intellectual Property Office of the People's Republic of China, Office Action and Search Report Issued in Application No. 201910108010.X, May 27, 2019, 34 pages (Submitted with Partial Translation).
(Continued)

*Primary Examiner* — Duy T Nguyen
(74) *Attorney, Agent, or Firm* — McCoy Russell LLP (57) ABSTRACT

The present disclosure relates to a photodiode, a method for preparing the same, and an electronic device. The photodiode includes: a first electrode layer and a semiconductor structure that are stacked, a surface of the semiconductor structure away from the first electrode layer having a first concave-convex structure; and a second electrode layer arranged on a surface of the semiconductor structure away
(Continued)

from the first electrode layer, a surface of the second electrode layer away from the first electrode layer having a second concave-convex structure.

8 Claims, 4 Drawing Sheets

(51) Int. Cl.
   *H01L 31/18* (2006.01)
   *H01L 31/20* (2006.01)
(58) Field of Classification Search
   USPC .......................................................... 257/428
   See application file for complete search history.

(56) References Cited

U.S. PATENT DOCUMENTS

| | | | | |
|---|---|---|---|---|
| 2010/0269897 | A1* | 10/2010 | Sakai | H01L 31/046 |
| | | | | 136/255 |
| 2011/0056557 | A1* | 3/2011 | Park | H01L 31/022425 |
| | | | | 136/258 |
| 2011/0162710 | A1* | 7/2011 | Watai | H01L 31/02363 |
| | | | | 136/256 |
| 2011/0278548 | A1 | 11/2011 | Takezoe et al. | |
| 2012/0240999 | A1* | 9/2012 | Yoshida | H01L 51/447 |
| | | | | 136/256 |
| 2015/0249170 | A1* | 9/2015 | Snaith | H01L 31/0725 |
| | | | | 136/256 |

FOREIGN PATENT DOCUMENTS

| | | |
|---|---|---|
| CN | 102652366 A | 8/2012 |
| CN | 104081534 A | 10/2014 |
| CN | 104377251 A | 2/2015 |
| CN | 109004047 A | 12/2018 |
| CN | 109817731 A | 5/2019 |
| JP | H07135328 A | 5/1995 |

OTHER PUBLICATIONS

ISA China National Intellectual Property Administration, International Search Report Issued in Application No. PCT/CN2020/072742, Apr. 15, 2020, WIPO, 13 pages (Submitted with Machine Translation).

* cited by examiner

PHOTODIODE, METHOD FOR PREPARING THE SAME, AND ELECTRONIC DEVICE

CROSS-REFERENCE TO RELATED APPLICATIONS

The present application is a U.S. national phase application of International Application No. PCT/CN2020/072742 filed on Jan. 17, 2020, which claims a priority to Chinese Patent Application No. 201910108010.X filed on Feb. 2, 2019. The entire contents of each of the above-listed applications are hereby incorporated by reference for all purposes.

TECHNICAL FIELD

The present disclosure relates to the field of photoelectric conversion technology, in particular, to a photodiode, a method for preparing the same, and an electronic device including the photodiode.

BACKGROUND AND SUMMARY

A photodiode is a semiconductor device that converts received optical signals into electrical signals. At present, when the photodiode is in operation, part of the light received thereby is reflected, resulting in a low conversion efficiency of the photodiode.

In one aspect, the present disclosure provides a photodiode, including:

a first electrode layer and a semiconductor structure that are stacked, in which a surface of the semiconductor structure away from the first electrode layer has a first concave-convex structure; and a second electrode layer arranged on the surface of the semiconductor structure away from the first electrode layer, in which a surface of the second electrode layer away from the first electrode layer has a second concave-convex structure.

Optionally, the semiconductor structure includes:

a first semiconductor layer arranged on a surface of the first electrode layer; and a second semiconductor layer arranged on a face of the first semiconductor layer away from the first electrode layer, in which a surface of the second semiconductor layer away from the first electrode layer has the first concave-convex structure;

in which one of the first semiconductor layer and the second semiconductor layer is a P-type semiconductor layer, and the other is an N-type semiconductor layer.

Optionally, the first semiconductor layer includes an N-type amorphous silicon layer, the second semiconductor layer includes a P-type amorphous silicon layer, and a surface of the P-type amorphous silicon away from the first electrode layer has the first concave-convex structure.

Optionally, the first semiconductor layer includes a P-type amorphous silicon layer, the second semiconductor layer comprises an N-type amorphous silicon layer, and a surface of the N-type amorphous silicon away from the first electrode layer has the first concave-convex structure.

Optionally, the semiconductor structure further includes an intrinsic amorphous silicon layer arranged between the N-type amorphous silicon layer and the P-type amorphous silicon layer.

Optionally, the semiconductor structure further includes an intrinsic amorphous silicon layer, in which the first semiconductor layer includes a P-type amorphous silicon layer, the intrinsic amorphous silicon layer is located on a surface of the P-type amorphous silicon layer away from the first electrode layer, and a surface of the intrinsic amorphous silicon layer away from the first electrode layer has a third concave-convex structure formed by crystallizing amorphous silicon in its surface; in which the second semiconductor layer includes an N-type metal oxide semiconductor layer arranged on a surface of the intrinsic amorphous silicon layer away from the first electrode layer, and a surface of the N-type metal oxide semiconductor layer away from the first electrode layer has the first concave-convex structure.

Optionally, the semiconductor structure further includes an intrinsic amorphous silicon layer, in which the first semiconductor layer includes an N-type metal oxide semiconductor layer, and the intrinsic amorphous silicon layer is located on a surface of the N-type metal oxide semiconductor layer away from the first electrode layer; in which the second semiconductor layer includes a P-type amorphous silicon layer arranged on a surface of the intrinsic amorphous silicon layer away from the first electrode layer, and a surface of the P-type amorphous silicon layer away from the first electrode layer has the first concave-convex structure formed by crystallizing amorphous silicon in its surface.

Optionally, the semiconductor structure further includes an intrinsic amorphous silicon layer, in which the first semiconductor layer includes an N-type metal oxide semiconductor layer, the intrinsic amorphous silicon layer is located on a surface of the N-type metal oxide semiconductor layer away from the first electrode layer, and the surface of the intrinsic amorphous silicon layer away from the first electrode layer has a third concave-convex structure formed by crystallizing amorphous silicon in its surface; in which the second semiconductor layer includes a P-type amorphous silicon layer arranged on a surface of the intrinsic amorphous silicon layer away from the first electrode layer, and a surface of the P-type amorphous silicon layer away from the first electrode layer has the first concave-convex structure.

Optionally, the first concave-convex structure, the second concave-convex structure, and the third concave-convex structure have substantially the same profile.

Optionally, the convexes in the first concave-convex structure, the second concave-convex structure, and the third concave-convex structure have a height in a direction perpendicular to a surface of the first electrode layer in contact with the semiconductor structure in a range from 30 nm to 80 nm, a maximum width in the direction parallel to the surface of the first electrode layer in contact with the semiconductor structure in a range from 0.1 µm to 0.5 µm, and a pitch between adjacent convexes in a range from 0.1 µm to 0.4 µm.

Optionally, in the above photodiode, the second electrode layer is a transparent electrode layer.

In another aspect, the present disclosure also provides an electronic device including the photodiode described in any one of the above.

In yet another aspect, the present disclosure also provides a method for preparing a photodiode, including:

preparing a first electrode layer;

preparing a semiconductor structure on a surface of the first electrode layer, in which a first concave-convex structure is formed in a surface of the semiconductor structure away from the first electrode layer; and depositing a second electrode layer on the surface of the semiconductor structure away from the first electrode layer, in which a second concave-convex structure is formed on the surface of the second electrode layer away from the first electrode layer.

Optionally, the preparing the semiconductor structure on the surface of the first electrode layer includes:

preparing a first semiconductor layer on a surface of the first electrode layer; and preparing a second semiconductor layer on a face of the first semiconductor layer away from the first electrode layer, and forming the first concave-convex structure on the surface of the second semiconductor layer away from the first electrode layer;

in which one of the first semiconductor layer and the second semiconductor layer is a P-type semiconductor layer, and the other is an N-type semiconductor layer.

Optionally, the preparing the first semiconductor layer and the second semiconductor layer includes irradiating a surface of the second semiconductor layer away from the first electrode layer by a laser, so that the surface of the second semiconductor layer away from the first electrode layer is crystallized to form the first concave-convex structure.

Optionally, the method further includes preparing an intrinsic amorphous silicon layer located between the N-type amorphous silicon layer and the P-type amorphous silicon layer.

Optionally, the preparing the first semiconductor layer and the second semiconductor layer includes:

preparing a P-type amorphous silicon layer on a surface of the first electrode layer;

preparing an intrinsic amorphous silicon layer on a surface of the P-type amorphous silicon layer away from the first electrode layer, and irradiating the surface of the intrinsic amorphous silicon layer away from the first electrode layer by a laser, so that the surface of the intrinsic amorphous silicon layer away from the first electrode layer is crystallized to form a third concave-convex structure; and depositing an N-type metal oxide semiconductor layer on the surface of the intrinsic amorphous silicon layer away from the first electrode layer, and forming the first concave-convex structure on the surface of the N-type metal oxide semiconductor layer away from the first electrode layer.

Optionally, the preparing the first semiconductor layer and the second semiconductor layer includes:

preparing an N-type metal oxide semiconductor layer on a surface of the first electrode layer;

preparing an intrinsic amorphous silicon layer on a surface of the N-type metal oxide semiconductor layer away from the first electrode layer; and depositing a P-type amorphous silicon layer on a surface of the intrinsic amorphous silicon layer away from the first electrode layer, and irradiating the surface of the P-type amorphous silicon layer away from the first electrode layer by a laser, so that the surface of the P-type amorphous silicon layer away from the first electrode layer is crystallized to form the first concave-convex structure.

Optionally, the preparing the first semiconductor layer and the second semiconductor layer includes:

preparing an N-type metal oxide semiconductor layer on a surface of the first electrode layer;

preparing an intrinsic amorphous silicon layer on a surface of the N-type metal oxide semiconductor layer away from the first electrode layer, and irradiating the surface of the intrinsic amorphous silicon layer away from the first electrode layer by a laser, so that the surface of the intrinsic amorphous silicon layer away from the first electrode layer is crystallized to form a third concave-convex structure; and depositing a P-type amorphous silicon layer on a surface of the intrinsic amorphous silicon layer away from the first electrode layer, and forming the first concave-convex structure in the surface of the P-type amorphous silicon layer away from the first electrode layer.

Optionally, the preparing the P-type amorphous silicon layer, the intrinsic amorphous silicon layer, the N-type metal oxide semiconductor layer and the second electrode layer includes:

sequentially depositing a P-type amorphous silicon thin film and an intrinsic amorphous silicon thin film that are stacked on a surface of the first electrode layer, and irradiating a surface of the intrinsic amorphous silicon thin film away from the first electrode layer by a laser, so as to crystallize the surface of the intrinsic amorphous silicon thin film away from the first electrode layer;

sequentially depositing an N-type metal oxide semiconductor thin film and a second electrode layer thin film on the surface of the intrinsic amorphous silicon thin film away from the first electrode layer, and patterning the N-type metal oxide semiconductor thin film and the second electrode layer thin film, to form the N-type metal oxide semiconductor layer and the second electrode layer; and etching the P-type amorphous silicon thin film and the intrinsic amorphous silicon thin film by using the N-type metal oxide semiconductor layer and the second electrode layer as a mask plate, to form the P-type amorphous silicon layer and the intrinsic amorphous silicon layer.

Optionally, the method further includes: washing the surface to be crystallized with an acidic solution before the crystallizing the surface of the semiconductor layer; and/or washing the surface to be crystallized with an acidic solution after crystallizing the surface of the semiconductor layer.

Optionally, in the above method for preparing a photodiode, the second electrode layer is a transparent electrode layer.

DETAILED DESCRIPTION

In order to further illustrate the photodiode, the method for preparing the same, and the electronic device provided by the embodiments of the present disclosure, the embodiments will be described in detail hereinafter in conjunction with the drawings. The following embodiments of the present disclosure are merely used to explain the technical solutions of the present disclosure, but are not to be construed as limiting on the present disclosure.

In the related art, the photodiode mainly includes: a semiconductor structure; and a first electrode and a second electrode that are arranged on two opposite surfaces of the semiconductor structure, respectively. At least one of the first electrode and the second electrode is a transparent electrode, which serves as a window layer for receiving light. The working principle of the photodiode is that light is incident to the photodiode through the transparent electrode of the photodiode. After the photodiode converts the received optical signals into electrical signals, and the electrical signals are output through the two electrodes of the photodiode.

The surface of the transparent electrode for receiving light is generally a substantially flat surface, so light is easily reflected by the flat surface when it is incident to the transparent electrode, resulting in low photoelectric conversion efficiency of the photodiode. In the related art, in order to solve the above-mentioned problem of low photoelectric conversion efficiency, an acidic solution is generally used to etch the surface of the transparent electrode for receiving light, so that the surface is uneven, thereby having an effect on reducing reflection. However, this method has a relatively poor controllability to the microstructure, is more destructive to the electrode film layer, and is prone to adversely affect the performance of the photoelectric conversion diode.

Based on the above problems in the related art, the present disclosure provides a photodiode, a method for preparing the same, and an electronic device including the photodiode, which solve the problem of low photoelectric conversion efficiency of the photodiode.

An embodiment according to the present disclosure provides a photodiode, including: a first electrode layer and a semiconductor structure that are stacked; and a second electrode layer arranged on a surface of the semiconductor structure away from the first electrode layer, in which the surface of the semiconductor structure away from the first electrode layer has a first concave-convex structure, and the surface of the second electrode layer away from the first electrode layer has a second concave-convex structure.

Optionally, the second electrode layer is a transparent electrode layer. The visible light transmittance of the transparent electrode layer is 70% or more. For example, when the transparent electrode layer is an ITO layer having a thickness of 700 Å, the transmittance to visible light at 400 nm is 70% or more.

In the above embodiment according to the present disclosure, when external light is received through the transparent electrode layer, the light is incident to the photodiode from the surface having the second concave-convex structure, and reduces the reflection effect of the transparent electrode layer to light. Moreover, since a first concave-convex structure is formed on the surface of the semiconductor structure receiving light, when the light is incident to the semiconductor structure through the surface having the first concave-convex structure, the reflection effect of the semiconductor structure on the light is further reduced. Therefore, the above embodiments according to the present disclosure can effectively reduce the reflection effect of the transparent electrode layer and the semiconductor structure on light, so that light can be incident to the semiconductor structure to the maximum extent, thereby improving the conversion efficiency of the photodiode. In addition, the above-described embodiments according to the present disclosure avoid etching the surface of the transparent electrode layer for receiving light by using an acidic solution in the related art, thereby avoiding damage to the electrode layer due to the etching of the acidic solution and adversely affecting the performance of the photoelectric conversion diode.

Figure 1:
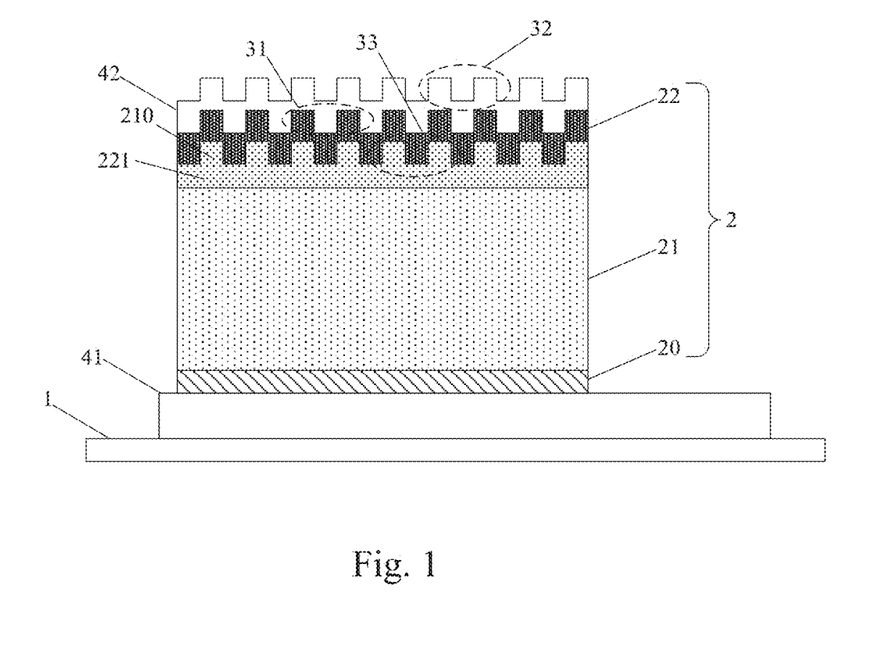
FIG. 1 is a schematic view showing the structure of the photodiode according to an embodiment of the present disclosure.

Specifically, as shown in FIG. 1, an embodiment of the present disclosure provides a photodiode, including: a first electrode layer 41 and a semiconductor structure 2 that are stacked; and a transparent electrode layer 42 arranged on a surface of the semiconductor structure 2 away from the first electrode layer 41, in which the surface of the semiconductor structure 2 away from the first electrode layer 41 has a first concave-convex structure 31, and the surface of the transparent electrode layer 42 away from the first electrode layer 41 has a second concave-convex structure 32.

When the above photodiode is prepared, the first electrode layer 41 may be firstly formed on the substrate 1, then the semiconductor structure 2 may be prepared on the surface of the first electrode layer 41 away from the substrate 1, the first concave-convex structure 31 may be formed in the surface of the semiconductor structure 2 away from the first electrode layer 41, and finally the transparent electrode layer 42 may be formed on the surface of the semiconductor structure 2 on which the first concave-convex structure 31 is formed, so that the surface of the transparent electrode layer 42 away from the first electrode layer 41 can form a second concave-convex structure 32. The first electrode layer 41 may be an opaque electrode. Both the size of the semiconductor structure 2 and the first concave-convex structure 31 formed thereon can be set according to actual needs. For example, the size of the semiconductor structure 2 is set so that its orthogonal projection on the substrate 1 is surrounded by the orthogonal projection of the first electrode layer 41 on the substrate 1. For example, the size of the first concave-convex structure 31 is set, so as to completely cover the surface of the semiconductor structure 2 away from the first electrode layer 41. The size of the transparent electrode layer 42 can also be set according to actual needs. For example, the size of the transparent electrode layer 42 is set to completely cover the first concave-convex structure 31, or the size of the transparent electrode layer 42 is set to cover a part of the first concave-convex structure 31.

When the photodiode of the above embodiment is in operation, light is incident to the photodiode from the surface of the transparent electrode layer 42 having the second concave-convex structure 32, and incident to the semiconductor structure 2 through the surface of the semiconductor structure 2 having the first concave-convex structure 31. After the semiconductor structure 2 converts the received light into an electrical signal, the electrical signal is output through the two electrodes of the photodiode.

According to the specific structure, preparation process and working process of the above photodiode, in the photodiode according to the embodiment of the present disclosure, the first concave-convex structure 31 is formed in the surface of the semiconductor structure 2 away from the first electrode layer 41, and the second concave-convex structure 32 is formed in the surface of the transparent electrode layer 42 away from the first electrode layer 41, thereby reducing the reflection effect of the transparent electrode layer 42 and the semiconductor structure 2 on light. Therefore, the photodiode according to the embodiment of the present disclosure can maximize the incidence of light to the semiconductor structure 2, thereby improving the photoelectric conversion efficiency of the photodiode. In addition, the embodiments of the present disclosure avoid damage to the electrode layer caused by etching the transparent electrode layer using an acidic solution in the related art.

In some embodiments, the above-mentioned semiconductor structure 2 may specifically include: a first semiconductor layer arranged on the surface of the first electrode layer; and a second semiconductor layer arranged on the surface of the first semiconductor layer away from the first electrode layer.

In the following embodiment, the surface of the second semiconductor layer away from the first electrode layer has a first concave-convex structure, and one of the first semiconductor layer and the second semiconductor layer is a P-type semiconductor layer and the other is an N-type semiconductor layer. In more detail, the above-mentioned semiconductor structure 2 may specifically include the following two structures. The first structure is characterized in that the semiconductor structure 2 includes a P-type semiconductor layer arranged on the surface of the first electrode layer, and an N-type semiconductor layer arranged on the surface of the P-type semiconductor layer away from the first electrode layer. The second structure is characterized in that the semiconductor structure 2 includes an N-type semiconductor layer arranged on the surface of the first electrode layer, and a P-type semiconductor layer arranged on the surface of the N-type semiconductor layer away from the first electrode layer.

The above semiconductor structure 2 is provided including an N-type semiconductor layer and a P-type semiconductor layer, so that the semiconductor structure 2 is formed with a PN junction. Moreover, in order to facilitate receiving the incident light, the area of the PN junction can be made as large as possible. After light (i.e., energy-carrying photons) is incident to the PN junction through the transparent electrode layer of the photodiode, it can transfer energy to the bound electrons on the covalent bond in the PN junction, so that some electrons can escape from the covalent bond, thereby generating an electron-hole pair. The electron-hole pair participates in the drifting movement under the action of reverse voltage, and makes the reverse current significantly increase. The greater the intensity of light, the greater the reverse current generated.

In some embodiments, the first semiconductor layer includes a P-type amorphous silicon layer, the second semiconductor layer includes an N-type amorphous silicon layer, and the surface of the N-type amorphous silicon layer away from the first electrode layer has a first concave-convex structure. Specifically, when the semiconductor structure of the above structure is prepared, a P-type amorphous silicon layer may be first prepared on the surface of the first electrode layer; then an N-type layer may be prepared on the surface of the P-type amorphous silicon layer away from the first electrode layer, and the surface of the N-type amorphous silicon layer away from the first electrode layer is irradiated by a laser, so that the surface of the N-type amorphous silicon layer away from the first electrode layer is crystallized to form a first concave-convex structure.

In some embodiments, the first semiconductor layer includes an N-type amorphous silicon layer, the second semiconductor layer includes a P-type amorphous silicon layer, and the surface of the P-type amorphous silicon layer away from the first electrode layer has a first concave-convex structure. Specifically, when the semiconductor structure of the above structure is prepared, an N-type amorphous silicon layer may be first prepared on the surface of the first electrode layer; then a P-type amorphous layer may be prepared on the surface of the N-type amorphous silicon layer away from the first electrode layer, the surface of the P-type amorphous silicon layer away from the first electrode layer is irradiated by a laser, so that the surface of the P-type amorphous silicon layer away from the first electrode layer is crystallized to form a first concave-convex structure.

For the above two embodiments, when a P-type amorphous silicon layer or an N-type amorphous silicon layer is prepared, an amorphous silicon thin film may be formed firstly, and then the amorphous silicon thin film is doped accordingly, to form a corresponding P-type amorphous silicon layer or N-type amorphous silicon layer.

In addition, when the P-type amorphous silicon layer or the N-type amorphous silicon layer is crystallized by a laser, the surface of the P-type amorphous silicon layer or the N-type amorphous silicon layer irradiated by the laser can form regularly arranged convexes, that is, the first concave-convex structure, so that the P-type amorphous silicon layer or the N-type amorphous silicon layer is formed as a film layer having an anti-reflection effect. Therefore, in the embodiments of the present disclosure, the surface of the P-type amorphous silicon layer or the N-type amorphous silicon layer is crystallized by a laser, so that the P-type amorphous silicon layer or the N-type amorphous silicon layer has an anti-reflection effect, and does not need to damage the semiconductor structure, thereby ensuring the performance of the photodiode.

Optionally, the semiconductor structure according to an embodiment of the present disclosure may further include an intrinsic amorphous silicon layer arranged between the N-type amorphous silicon layer and the P-type amorphous silicon layer.

Specifically, an intrinsic amorphous silicon layer is arranged between the N-type amorphous silicon layer and the P-type amorphous silicon layer, so that the semiconductor structure is formed as a PIN junction. When the photodiode adopts the structure of the semiconductor structure 2, it has the advantages of small junction capacitance, short transit time, high sensitivity, etc. In more detail, the intrinsic amorphous silicon layer is generally an N-type semiconductor layer with a low doping concentration (for example, an N-type amorphous silicon layer). The intrinsic semiconductor layer introduced in the PN junction increases the thickness in a direction perpendicular to the surface of the first electrode layer 41 in contact with the semiconductor structure 2. This not only increases the width of the depletion region of the semiconductor structure, but also it almost occupies the entire depletion region, so that most of the incident light is absorbed in the intrinsic semiconductor layer and generates a large number of electron-hole pairs, while the thickness of the N-type amorphous silicon layer and the P-type amorphous silicon layer on both sides of the intrinsic semiconductor layer in the direction perpendicular to the surface of the first electrode layer in contact with the semiconductor structure 2 is thinner, and the proportion of the absorbed incident light is small. Therefore, the influence of diffusion motion is reduced, and the response speed of the photodiode is improved.

In some embodiments, as shown in FIG. 1, the semiconductor structure 2 according to the above embodiment further includes an intrinsic amorphous silicon layer 21. Therefore, the first semiconductor layer 2 includes a P-type amorphous silicon layer 20, an intrinsic amorphous silicon layer 21, and an N-type amorphous silicon layer 22 that are stacked. The intrinsic amorphous silicon layer 21 is located on the surface of the P-type amorphous silicon layer 20 away from the first electrode layer 41, and a surface layer 211 of the intrinsic amorphous silicon layer 21 away from the first electrode layer 41 is crystallized to form a third concave-convex structure 33. The second semiconductor layer includes an N-type metal oxide semiconductor layer 22 arranged on the surface of the intrinsic amorphous silicon layer 21 away from the first electrode layer 41, and the surface of the N-type metal oxide semiconductor layer 22 away from the first electrode layer 41 has the first concave-convex structure 31. Optionally, the first concave-convex structure 31 has substantially the same profile as the third concave-convex structure 33.

Specifically, when the semiconductor structure 2 includes the P-type amorphous silicon layer 20, the intrinsic amorphous silicon layer 21, and the N-type metal oxide semiconductor layer 22 that are sequentially stacked on the first electrode layer 41, the surface of the intrinsic amorphous silicon layer 21 away from the first electrode layer 41 is irradiated by a laser, so that the surface of the intrinsic amorphous silicon layer 21 away from the first electrode layer 41 is crystallized to form a third concave-convex structure 33. Then, a thinner P-type amorphous silicon layer with grain boundary convexes 210 is formed on the surface layer 211 of the intrinsic amorphous silicon layer away from the first electrode layer 41. Then, an N-type metal oxide semiconductor layer 22 is deposited on the surface of the P-type amorphous silicon layer away from the first electrode layer 41, so that the surface of the formed N-type metal oxide semiconductor layer 22 away from the first electrode layer 41 has a first concave-convex structure 31. Finally, a transparent electrode layer 42 is formed on the surface of the N-type metal oxide semiconductor layer away from the first electrode layer 41, so that the surface of the formed transparent electrode layer 42 away from the first electrode layer 41 has a second concave-convex structure 32.

In view of this, the above embodiments of the present disclosure reduce the reflection of incident light by forming concave-convex structures on the surfaces of the intrinsic amorphous silicon layer 21, the N-type metal oxide semiconductor layer 22, and the transparent electrode layer 42. Therefore, the above embodiments of the present disclosure can further effectively improve the photoelectric conversion efficiency of the photodiode, and enable the photodiode to achieve a higher signal-to-noise ratio. In addition, the above embodiment of the present disclosure achieves various manners of reducing the reflection of incident light without adding an additional patterning process, and does not damage the semiconductor structure 2.

In some embodiments, the semiconductor structure further includes an intrinsic amorphous silicon layer. The first semiconductor layer includes an N-type metal oxide semiconductor layer, and the intrinsic amorphous silicon layer is located a surface of N-type metal oxide semiconductor layer away from the first electrode layer; the second semiconductor layer includes a P-type amorphous silicon layer arranged on the surface of the intrinsic amorphous silicon layer away from the first electrode layer, and a surface of the P-type amorphous silicon layer away from the first electrode layer has a first concave-convex structure.

Specifically, when the semiconductor structure of the above structure is prepared, an N-type metal oxide semiconductor layer may be first prepared on the surface of the first electrode layer, then an intrinsic amorphous silicon layer is prepared on the surface of the N-type metal oxide semiconductor layer away from the first electrode layer, and then a P-type amorphous silicon layer is prepared on the surface of the intrinsic amorphous silicon layer away from the first electrode layer, and the surface of the P-type amorphous silicon layer away from the first electrode layer is irradiated by a laser, so that the surface of the P-type amorphous silicon layer away from the first electrode layer is crystallized to form regularly arranged convexes, that is, first concave-convex structure. The P-type amorphous silicon layer is formed as a film layer having an anti-reflection effect, and the transparent electrode layer formed on the surface of the P-type amorphous silicon layer away from the first electrode layer also has a concave-convex structure having the same or similar profile, that is, the second concave-convex structure, so that the transparent electrode layer also has an anti-reflection effect.

In the above method, the surface of the P-type amorphous silicon layer is crystallized by a laser, so that the P-type amorphous silicon layer has an anti-reflection effect, and does not need to damage the semiconductor structure, thereby ensuring the working performance of the photodiode.

An embodiment of the present disclosure also provides an electronic device, including the photodiode of any of the above embodiments.

The electronic device according to the embodiment of the present disclosure includes the light emitting diode according to any of the above embodiments, so that the electronic device also has the above beneficial effects, which will not be repeated herein.

An embodiment of the present disclosure also provides a method for preparing a photodiode, that is used to prepare the photodiode according to any of the above embodiments, as shown in FIGS. 2a to 2e, the method including:

preparing a first electrode layer 41;

preparing a semiconductor structure 2 on a surface of the first electrode layer 41, in which a first concave-convex structure 31 is formed in a surface of the semiconductor structure 2 away from the first electrode layer 41; and depositing a second electrode layer 42 on the surface of the semiconductor structure 2 away from the first electrode layer 41, in which a second concave-convex structure 32 is formed in the surface of the second electrode layer 42 away from the first electrode layer 41.

Specifically, the first electrode layer 41 may be prepared on the substrate 1 using a conductive material. The degree of transparency of the first electrode layer 41 is not limited. Then, a semiconductor structure 2 is prepared on a surface of the first electrode layer 41, and a first concave-convex structure 31 is formed in a surface of the semiconductor structure 2 away from the first electrode layer 41. It should be noted that both the size of the semiconductor structure 2 and the first concave-convex structure 31 formed thereon can be set according to actual needs. Finally, a transparent electrode layer 42 is prepared on the surface of the semiconductor structure 2 in which the first concave-convex structure 31 is formed, and the transparent electrode layer 42 continues the profile of the first concave-convex structure to form a concave-convex structure, that is, a second concave-convex structure 32 is formed in the surface of the transparent electrode layer 42 away from the first electrode layer 41. The size of the transparent electrode layer 42 can also be set according to actual needs.

In the method for preparing the photodiode according to an embodiment of the present disclosure, the first concave-convex structure 31 is formed in the surface of the semiconductor structure 2 away from the first electrode layer 41, and the transparent electrode layer 42 prepared on the surface of the semiconductor structure 2 in which the first concave-convex structure 31 is formed can form the second concave-convex structure 32. When external light is received through the transparent electrode layer 42, the reflection effect of the transparent electrode layer 42 and the semiconductor structure 2 on light is reduced. Therefore, the photodiode according to the embodiment of the present disclosure can maximize the incidence of light to the semiconductor structure 2, thereby improving the photoelectric conversion efficiency of the photodiode. Moreover, the provision of the concave-convex structure on both the surfaces of the semiconductor structure 2 and the transparent electrode layer 42 avoids the etching of the surface of the transparent electrode layer 42 by using an acidic solution in the related art, thereby avoiding damage to the electrode layer due to the etching of the acidic solution and adversely affecting the performance of the photoelectric conversion diode. Therefore, the method of preparing the photodiode according to an embodiment of the present disclosure is a non-destructive solution.

Optionally, the preparing the semiconductor structure on the surface of the first electrode layer specifically includes:

preparing a first semiconductor layer on a surface of the first electrode layer; and preparing a second semiconductor layer on a surface of the first semiconductor layer away from the first electrode layer, and forming the first concave-convex structure in the surface of the second semiconductor layer away from the first electrode layer.

Optionally, one of the first semiconductor layer and the second semiconductor layer is a P-type semiconductor layer, and the other is an N-type semiconductor layer. Specifically, the semiconductor structure prepared by the above method includes the following two structures.

The first structure is characterized in that the semiconductor structure includes a P-type semiconductor layer arranged on the surface of the first electrode layer, and an N-type semiconductor layer arranged on the surface of the P-type semiconductor layer away from the first electrode layer.

The second structure is characterized in that the semiconductor structure includes an N-type semiconductor layer arranged on the surface of the first electrode layer, and a P-type semiconductor layer arranged on the surface of the N-type semiconductor layer away from the first electrode layer.

The above semiconductor structure is provided including an N-type semiconductor layer and a P-type semiconductor layer, so that the semiconductor structure is formed with a PN junction. After light is incident to the PN junction through the transparent electrode layer of the photodiode, it can transfer energy to the bound electrons on the covalent bond in the PN junction, so that some electrons can escape from the covalent bond, thereby generating an electron-hole pair. The electron-hole pair participates in the drifting movement under the action of reverse voltage, and makes the reverse current significantly increase. The greater the intensity of light, the greater the reverse current generated.

In some embodiments, the preparing the first semiconductor layer and the second semiconductor layer may specifically include: preparing an N-type amorphous silicon layer on the surface of the first electrode layer; and preparing a P-type amorphous silicon layer on the surface of the first electrode layer away from the N-type amorphous silicon layer, and irradiating the surface of the P-type amorphous silicon layer away from the first electrode layer by a laser, so that the surface of the P-type amorphous silicon layer away from the first electrode layer is crystallized to form a first concave-convex structure.

In other embodiments, the above preparing the first semiconductor layer and the second semiconductor layer may specifically include: preparing a P-type amorphous silicon layer on the surface of the first electrode layer; preparing an N-type layer on the surface of the P-type amorphous silicon layer away from the first electrode layer, and irradiating the surface of the N-type amorphous silicon layer away from the first electrode layer by a laser, so that the surface of the N-type amorphous silicon layer away from the first electrode layer is crystallized to form a first concave-convex structure.

For the above two embodiments, when a P-type amorphous silicon layer and an N-type amorphous silicon layer is prepared, an amorphous silicon thin film may be formed firstly, and then the amorphous silicon thin film is doped accordingly, to form a corresponding P-type amorphous silicon layer and N-type amorphous silicon layer.

In addition, when the P-type amorphous silicon layer or the N-type amorphous silicon layer is crystallized by a laser, the surface of the P-type amorphous silicon layer or the N-type amorphous silicon layer irradiated by the laser can form regularly arranged convexes, that is, the first concave-convex structure, so that the P-type amorphous silicon layer or the N-type amorphous silicon layer is formed as a film layer having an anti-reflection effect. Therefore, in the embodiments of the present disclosure, the surface of the P-type amorphous silicon layer or the N-type amorphous silicon layer is crystallized by a laser, so that the P-type amorphous silicon layer or the N-type amorphous silicon layer has an anti-reflection effect, and does not need to damage the semiconductor structure, thereby ensuring the working performance of the photodiode.

Optionally, the preparation method according to an embodiment of the present disclosure may further include preparing an intrinsic amorphous silicon layer between the N-type amorphous silicon layer and the P-type amorphous silicon layer. Specifically, the intrinsic amorphous silicon layer is generally an N-type amorphous silicon layer with a low doping concentration. When the intrinsic amorphous silicon layer is prepared, the amorphous silicon layer may be formed first, and then doped with low concentration ions, to form the intrinsic amorphous silicon layer. In more detail, an intrinsic amorphous silicon layer is arranged between the N-type amorphous silicon layer and the P-type amorphous silicon layer, so that the semiconductor structure is formed as a PIN junction. When the photodiode adopts such structure of the semiconductor structure, it has the advantages of small junction capacitance, short transit time, high sensitivity, etc.

In some embodiments, the preparing the first semiconductor layer and the second semiconductor layer may further specifically include:

preparing an N-type metal oxide semiconductor layer on a surface of the first electrode layer;

preparing an intrinsic amorphous silicon layer on a surface of the N-type metal oxide semiconductor layer away from the first electrode layer; and depositing a P-type amorphous silicon layer on a surface of the intrinsic amorphous silicon layer away from the first electrode layer, and irradiating the surface of the P-type amorphous silicon layer away from the first electrode layer by a laser, so that the surface of the P-type amorphous silicon layer away from the first electrode layer is crystallized to form the first concave-convex structure.

Specifically, when the semiconductor structure of the above structure is prepared, an N-type metal oxide semiconductor layer may be first prepared on the surface of the first electrode layer, then an intrinsic amorphous silicon layer is prepared on the surface of the N-type metal oxide semiconductor layer away from the first electrode layer, and then a P-type amorphous silicon layer is prepared on the surface of the intrinsic amorphous silicon layer away from the first electrode layer, and the surface of the P-type amorphous silicon layer away from the first electrode layer is irradiated by a laser, so that the surface of the P-type amorphous silicon layer away from the first electrode layer is crystallized to form regularly arranged convexes, that is, first concave-convex structure. The P-type amorphous silicon layer is formed as a film layer having an anti-reflection effect, and the transparent electrode layer formed on the surface of the P-type amorphous silicon layer away from the first electrode layer continues to form a same or similar concave-convex structure, that is, the second concave-convex structure, so that the transparent electrode layer also has an anti-reflection effect.

In the above method, the surface of the P-type amorphous silicon layer is crystallized by a laser, so that the P-type amorphous silicon layer has an anti-reflection effect, and does not need to damage the semiconductor structure, thereby ensuring the working performance of the photodiode.

In other embodiments, as shown in FIG. 1, the preparing the first semiconductor layer and the second semiconductor layer may further specifically include:

preparing a P-type amorphous silicon layer 20 on a surface of the first electrode layer 41;

preparing an intrinsic amorphous silicon layer 21 on the surface of the P-type amorphous silicon layer 20 away from the first electrode layer 41, and irradiating the surface of the intrinsic amorphous silicon layer 21 away from the first electrode layer 41 by a laser, so as to crystallize the surface of the amorphous silicon layer 21 away from the first electrode layer 41; and depositing an N-type metal oxide semiconductor layer 22 on the surface of the intrinsic amorphous silicon layer 21 away from the first electrode layer 41, in which a first concave-convex structure 31 is formed in the surface of the N-type metal oxide semiconductor layer 22 away from the first electrode layer 41.

Specifically, when the semiconductor structure 2 includes the P-type amorphous silicon layer 20, the intrinsic amorphous silicon layer 21, and the N-type metal oxide semiconductor layer 22 that are sequentially stacked on the first electrode layer 41, the surface of the intrinsic amorphous silicon layer 21 away from the first electrode layer 41 is irradiated by a laser, so that the surface of the intrinsic amorphous silicon layer 21 away from the first electrode layer 41 is crystallized. Then, a thinner P-type amorphous silicon layer with grain boundary convexes 210 is formed on the surface of the intrinsic amorphous silicon layer away from the first electrode layer 41, in which regularly arranged convexes 210 are formed in the surface of the P-type amorphous silicon layer away from the first electrode layer 41. Then, an N-type metal oxide semiconductor layer 22 is deposited on the surface of the P-type amorphous silicon layer away from the first electrode layer 41, so that the formed N-type metal oxide semiconductor layer 22 can continue the morphology of the convexes 210 produced by P-type amorphous silicon layer, and the surface of the N-type metal oxide semiconductor layer 22 away from the first electrode layer 41 has the first concave-convex structure 31. Finally, a transparent electrode layer 42 is formed on the surface of the N-type metal oxide semiconductor layer 22 away from the first electrode layer 41, so that the surface of the formed transparent electrode layer 42 away from the first electrode layer 41 continues the first concave-convex structure 31, so as to form the second concave-convex structure 32. Optionally, the first concave-convex structure 31 and the second concave-convex structure have the same or similar convex profile.

It should be noted that the thinner P-type amorphous silicon layer with grain boundary convexes 210 has a light absorption coefficient lower than that of the intrinsic amorphous silicon layer, so the formed thinner P-type amorphous silicon layer with grain boundary convexes 210 will not enhance the attenuation of incident light, and is more conducive to increasing the amount of incident light.

Likewise, the above preparation method according to an embodiment of the present disclosure forms the regularly arranged convexes 210 by crystallizing the surface of the intrinsic amorphous silicon layer 21 by a laser, so that the surface of the N-type metal oxide semiconductor layer 22 away from the first electrode layer 41 continues to be formed with a first concave-convex structure 31, and the surface of the transparent electrode layer 42 away from the first electrode layer 41 continues to be formed with a second concave-convex structure 32, thereby realizing the surfaces of the intrinsic amorphous silicon layer 21, the N-type metal oxide semiconductor layer 22 and the transparent electrode layer 42 for receiving light to be uneven, and achieving the effect of an incident light anti-reflection layer. Therefore, the embodiments of the present disclosure can effectively improve the photoelectric conversion efficiency of the photodiode, thereby enabling the photodiode to achieve a higher signal-to-noise ratio. Moreover, the above manner of realizing the effect of the incident light anti-reflection layer does not need to increase the patterning process, and does not cause damage to the semiconductor structure 2, which ensures the working performance of the photodiode.

It can be seen from the foregoing embodiments that the preparation method according to the embodiments of the present disclosure is not only applicable to photodiodes having a metal oxide heterojunction, but also applicable to conventional photodiodes including only an amorphous silicon homojunction.

In the above embodiments, before the crystallization operation by laser, an acidic solution (for example, a low concentration of hydrofluoric acid) may be used to wash the surface of the film layer to be crystallized, so as to ensure the crystallization effect. Moreover, after the crystallization operation, the surface of the crystallized film layer can also be washed with an acidic solution, so as to remove impurities generated during the crystallization process.

For example, when the intrinsic amorphous silicon layer is irradiated by a laser, silicon oxide ($SiO_x$, where $0<x\leq2$) is easily generated on the surface of the intrinsic amorphous silicon layer, and the crystallized surface of intrinsic amorphous silicon layer is washed by an acidic solution, thereby being capable of removing the silicon oxide $SiO_x$ produced, which is more conducive to ensuring a good crystallization effect.

Optionally, when the semiconductor layer is crystallized by a laser, the size of the convexes 210 generated on the crystallized surface of the film layer can be controlled by adjusting the irradiation speed and energy density of the laser. For example, the formed convex 210 may have a height in a direction perpendicular to a surface of the first electrode layer 41 in contact with the semiconductor structure 2 in a range from 30 nm to 80 nm, a maximum width in the direction parallel to the surface of the first electrode layer 41 in contact with the semiconductor structure 2 in a range from 0.1 μm to 0.5 μm, and a pitch between adjacent convexes 210 in a range from 0.1 μm to 0.4 μm.

Further, as shown in FIGS. 2a to 2e, the above preparing the P-type amorphous silicon layer 20, the intrinsic amorphous silicon layer 21, the N-type metal oxide semiconductor layer 22, and the transparent electrode layer 42 specifically include the following steps.

Figure 2A:
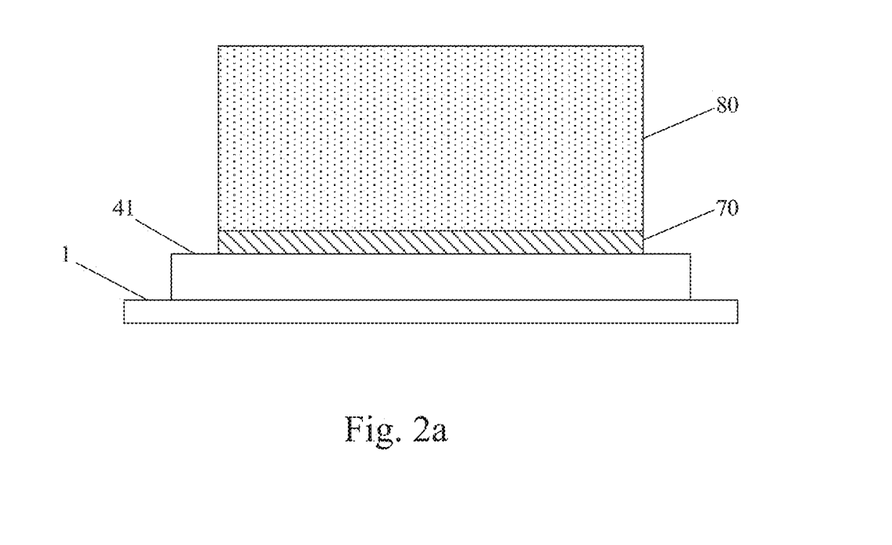
FIGS. 2a to 2e are schematic views showing the structures prepared by various steps in the method for preparing the photodiode according to an embodiment of the present disclosure.
Figure 2B:
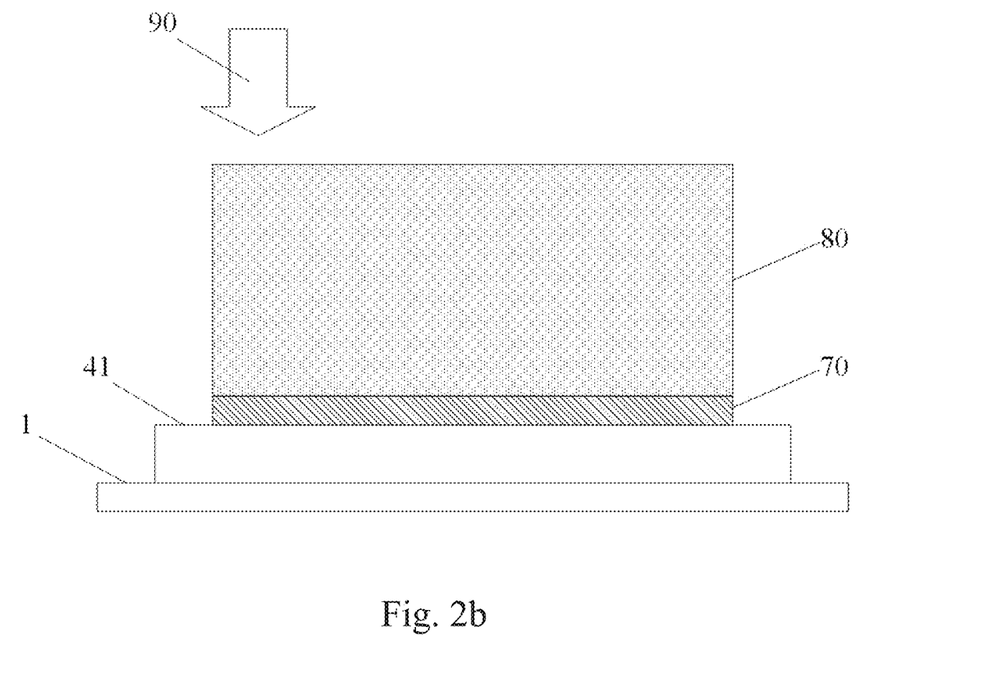
Figure 2C:
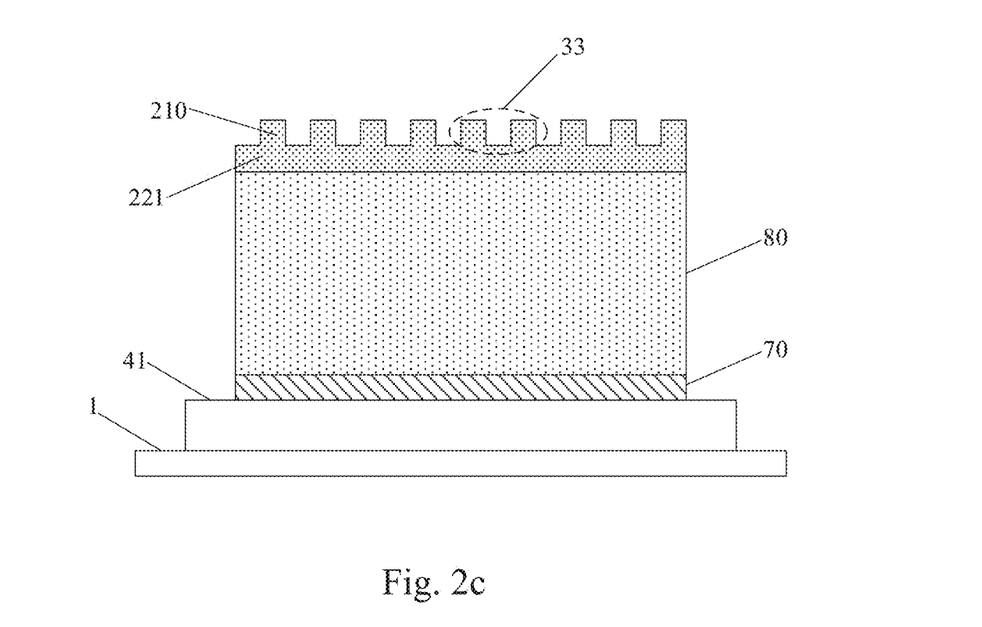

As shown in FIG. 2a, a P-type amorphous silicon thin film 70 and an intrinsic amorphous silicon thin film 80 that are stacked in sequence are formed on the surface of the first electrode layer 41. As shown in FIG. 2b, the surface of the intrinsic amorphous silicon thin film 80 away from the first electrode layer 41 is irradiated with a laser 90. As shown in FIG. 2c, the surface of the intrinsic amorphous silicon thin film 80 away from the first electrode layer 41 is crystallized to form a third concave-convex structure 33. In FIG. 2c, the straight line between the intrinsic amorphous silicon thin film 80 and the convex 210 represents a schematic cross-sectional line of the interface between the crystallized and uncrystallized semiconductor layers. In practice, the cross section of the interface is not straight, but it is only for illustration herein.

Figure 3:
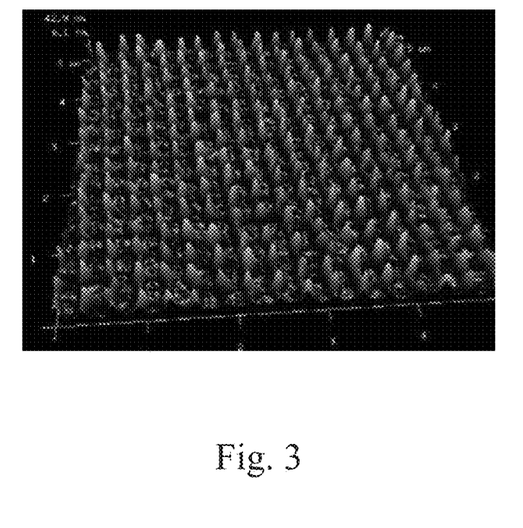
FIG. 3 is a transmission electron micrograph showing the surface of the semiconductor layer after the crystallizing the surface of the semiconductor layer in the method according to an embodiment of the present disclosure.

As can be seen from the TEM image shown in FIG. 3, the third concave-convex structure 33 formed in the surface of the intrinsic layer by the crystallization method of the embodiment of the present disclosure has uniform convexes. Not only on the intrinsic layer, but also on the N-type semiconductor layer (oxide semiconductor layer or amorphous silicon semiconductor layer) or P-type semiconductor layer, the uniform convexes as shown in FIG. 3 can be formed.

Figure 4A:
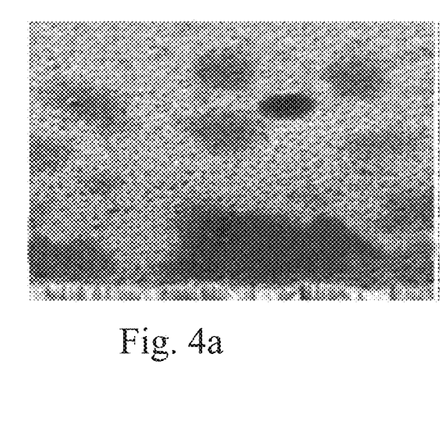
FIGS. 4a to 4b are scanning electron micrograph showing the surface of the transparent electrode layer before and after acid etching the surface of the transparent electrode layer of the photodiode in the related art.
Figure 4B:
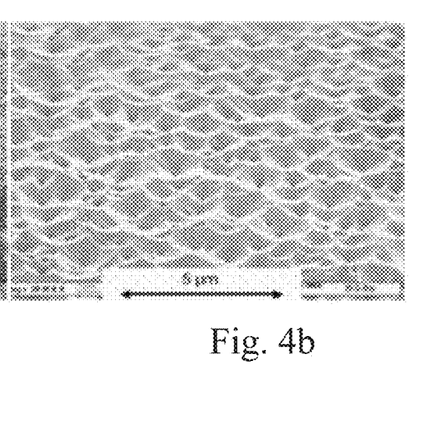

In contrast, the related art often uses an acid to etch the transparent oxide electrode to form convexes, so as to achieve the effect of anti-reflection. This method is to immerse the deposited electrode thin film (such as ZnO) directly in an acidic solution (such as HCl). Because process parameters such as immersing time and temperature are difficult to control uniformly, the uniformity of the formed convexes is not good, and the size of is a range from a few micrometers to a few micrometers. For example, as shown in the scanning electron micrographs of FIGS. 4a and 4b, the size of the convexes formed in the surface of the transparent electrode is uneven. Moreover, the acid is extremely corrosive and has strong corrosivity to the transparent electrode, thereby destroying the electrode performance. In the method of the present disclosure, the laser crystallization method does not cause damage to the electrode, and thus is a non-destructive solution.

Figure 2D:
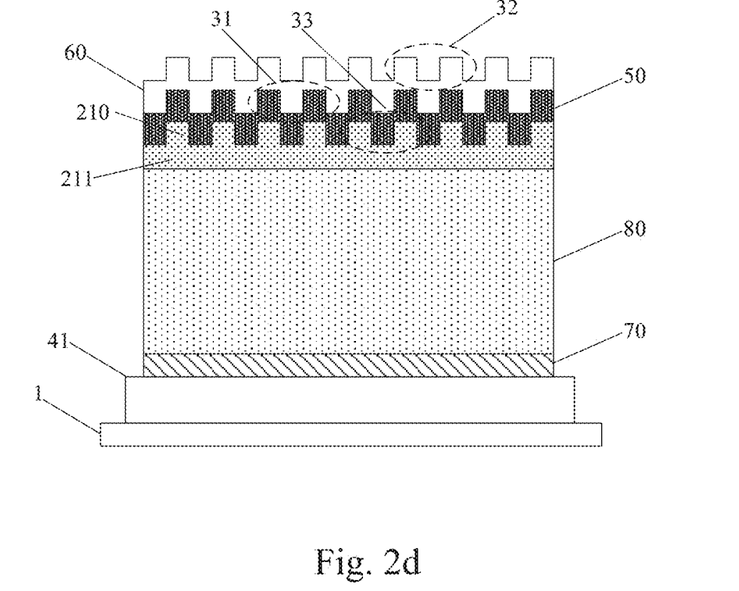
Figure 2E:
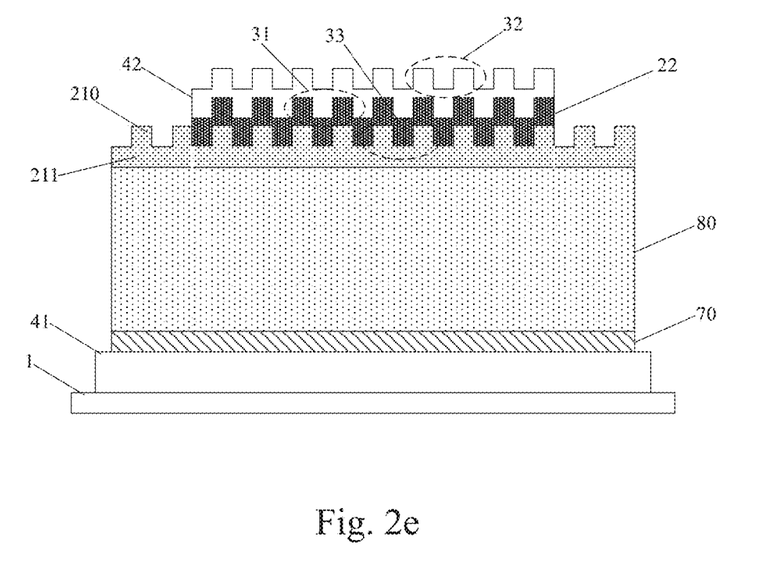

As shown in FIGS. 2d and 2e, an N-type metal oxide semiconductor thin film 50 and a transparent electrode thin film 60 that are stacked in sequence are deposited on the surface of the intrinsic amorphous silicon thin film 80 away from the first electrode layer 41. Then, the N-type metal oxide semiconductor thin film 50 and the transparent electrode thin film 60 are patterned to form the N-type metal oxide semiconductor layer 22 and the transparent electrode layer 42.

As shown in FIG. 2e, the N-type metal oxide semiconductor layer 22 and the transparent electrode layer 42 are used as masks, the P-type amorphous silicon thin film 70 and the intrinsic amorphous silicon thin film 80 are etched to form a P-type amorphous silicon layer 20 and the intrinsic amorphous silicon layer 21. Thus, the photodiode shown in FIG. 1 is prepared.

Specifically, the P-type amorphous silicon thin film 70 may be first formed on the surface of the first electrode layer 41, and the intrinsic amorphous silicon thin film 80 may be formed on the surface of the P-type amorphous silicon thin film 70 away from the first electrode layer 41. Then, the surface of the intrinsic amorphous silicon thin film 80 away from the first electrode layer 41 is irradiated by a laser, so that the surface of the intrinsic amorphous silicon thin film 80 away from the first electrode layer 41 is crystallized to form a concave-convex structure 33 with uniform convexes 210. Then, an N-type metal oxide semiconductor material is deposited on the surface of the intrinsic amorphous silicon thin film 80 away from the first electrode layer 41 to form an N-type metal oxide semiconductor thin film 50. Then, a transparent conductive material made from a transparent electrode thin film 60 is deposited on the surface of the N-type metal oxide semiconductor thin film 50 away from the first electrode layer 41. In a direction perpendicular to the surface of the first electrode layer 41 in contact with the semiconductor layer, the transparent electrode thin film 60 overlaps the N-type metal oxide semiconductor thin film 50. Next, a photoresist is formed on the surface of the transparent electrode thin film 60 away from the first electrode layer 41, and the photoresist is exposed using a mask plate to form a photoresist reserved region and a photoresist removal region. The photoresist reserved region corresponds to the region in which the N-type metal oxide semiconductor layer 22 and the transparent electrode layer 42 are located, and the photoresist removal region corresponds to the region other than the region in which the N-type metal oxide semiconductor layer 22 and the transparent electrode layer 42 are located. The photoresist located in the photoresist removal region is removed by a developing solution, and the N-type metal oxide semiconductor thin film 50 and the transparent electrode thin film 60 located in the photoresist removal region are etched, so as to remove the N-type metal oxide semiconductor film 50 and the transparent electrode thin film 60 in the photoresist removal region, thereby forming the N-type metal oxide semiconductor layer 22 and the transparent electrode layer 42. Finally, the photoresist located in the photoresist reserved region is stripped.

There are various types of N-type metal oxide semiconductor materials that can be selected. For example, a multiple material of indium, gallium, zinc and oxygen can be selected, such as indium gallium zinc oxide (IGZO); or a multiple material of indium, gallium, zinc and oxygen doped with different contents of tin (Sn) can be selected, such as IGZTO.

Optionally, after the N-type metal oxide semiconductor layer 22 and the transparent electrode layer 42 are formed, the N-type metal oxide semiconductor layer 22 and the transparent electrode layer 42 can be directly used as a mask plate for dry etching the P-type amorphous silicon thin film 70 and the intrinsic amorphous silicon thin film 80, so as to form a P-type amorphous silicon layer 20 and an intrinsic amorphous silicon layer 21.

The above method for preparing the P-type amorphous silicon layer 20 and the intrinsic amorphous silicon layer 21 can not only realize the simultaneous formation of the P-type amorphous silicon layer 20 and the intrinsic amorphous silicon layer 21 through a single patterning process, but also directly use the N-type metal oxide semiconductor layer 22 and the transparent electrode layer 42 as a mask plate for patterning the P-type amorphous silicon thin film 70 and the intrinsic amorphous silicon thin film 80. Therefore, this method avoids separately preparing a mask plate for patterning the P-type amorphous silicon thin film 70 and the intrinsic amorphous silicon thin film 80, thereby simplifying the preparing process flow of the photodiode and saving the preparation cost. In addition, the above method for preparing the N-type metal oxide semiconductor layer 22 and the transparent electrode layer 42 can realize the simultaneous formation of the N-type metal oxide semiconductor layer 22 and the transparent electrode layer 42 through a single patterning process, thereby further simplifying the preparing process flow of the photodiode and saving the preparation cost.

Unless otherwise defined, technical terms or scientific terms used herein have the normal meaning commonly understood by one skilled in the art in the field of the present disclosure. The words "first", "second", "third", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly. When an element, such as a layer, film, region, or substrate, is referred to as being "on" or "under" another element, the element may be directly "on" or "under" another element, or there may be an intermediate element. In the above embodiments, the specific features, structures, materials or features may be combined in any suitable manner in any one or more embodiments or examples.

The above description is merely the optional embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

The invention claimed is:

1. A photodiode, comprising:
a first electrode layer and a semiconductor structure that are stacked, wherein a surface of the semiconductor structure away from the first electrode layer has a first concave-convex structure, wherein the first concave-convex structure is crystallized; and
a second electrode layer arranged on the surface of the semiconductor structure away from the first electrode layer, wherein a surface of the second electrode layer away from the first electrode layer has a second concave-convex structure,
wherein the semiconductor structure comprises:
a first semiconductor layer arranged on a surface of the first electrode layer; and
a second semiconductor layer arranged on a face of the first semiconductor layer away from the first electrode layer, wherein a surface of the second semiconductor layer away from the first electrode layer has the first concave-convex structure,
wherein the semiconductor structure further comprises an intrinsic amorphous silicon layer; wherein the first semiconductor layer comprises a P-type amorphous silicon layer, the intrinsic amorphous silicon layer is located on a surface of the P-type amorphous silicon layer away from the first electrode layer, and a surface of the intrinsic amorphous silicon layer away from the first electrode layer has a third concave-convex structure formed by crystallizing amorphous silicon in its surface; and wherein the second semiconductor layer comprises an N-type metal oxide semiconductor layer arranged on a surface of the intrinsic amorphous silicon layer away from the first electrode layer, and a surface of the N-type metal oxide semiconductor layer away from the first electrode layer has the first concave-convex structure, or wherein the semiconductor structure further comprises an intrinsic amorphous silicon layer; wherein the first semiconductor layer comprises an N-type metal oxide semiconductor layer, the intrinsic amorphous silicon layer is located on a surface of the N-type metal oxide semiconductor layer away from the first electrode layer, and the surface of the intrinsic amorphous silicon layer away from the first electrode layer has a third concave-convex structure formed by crystallizing amorphous silicon in its surface; and wherein the second semiconductor layer comprises a P-type amorphous silicon layer arranged on a surface of the intrinsic amorphous silicon layer away from the first electrode layer, and a surface of the P-type amorphous silicon layer away from the first electrode layer has the first concave-convex structure.

2. The photodiode of claim 1, wherein the first concave-convex structure, the second concave-convex structure, and the third concave-convex structure have substantially the same profile.

3. The photodiode of claim 1, wherein the convexes in the first concave-convex structure, the second concave-convex structure, and the third concave-convex structure have a height in a direction perpendicular to a surface of the first electrode layer in contact with the semiconductor structure in a range from 30 nm to 80 nm, a maximum width in the direction parallel to the surface of the first electrode layer in contact with the semiconductor structure in a range from 0.1 μm to 0.5 μm, and a pitch between adjacent convexes in a range from 0.1 μm to 0.4 μm.

4. The photodiode of claim 1, wherein the second electrode layer is a transparent electrode layer.

5. An electronic device comprising the photodiode of claim 1.

6. The electronic device of claim 5, wherein the first concave-convex structure, the second concave-convex structure, and the third concave-convex structure have substantially the same profile.

7. The electronic device of claim 5, wherein the convexes in the first concave-convex structure, the second concave-convex structure, and the third concave-convex structure have a height in a direction perpendicular to a surface of the first electrode layer in contact with the semiconductor structure in a range from 30 nm to 80 nm, a maximum width in the direction parallel to the surface of the first electrode layer in contact with the semiconductor structure in a range from 0.1 μm to 0.5 μm, and a pitch between adjacent convexes in a range from 0.1 μm to 0.4 μm.

8. The electronic device of claim 5, wherein the second electrode layer is a transparent electrode layer.

* * * * *